(12) United States Patent
Kato et al.

(10) Patent No.: US 9,035,370 B2
(45) Date of Patent: May 19, 2015

(54) SEMICONDUCTOR DEVICE

(75) Inventors: Yoshiko Kato, Kanagawa-ken (JP); Hiroyuki Kutsukake, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 568 days.

(21) Appl. No.: 13/415,010

(22) Filed: Mar. 8, 2012

(65) Prior Publication Data

US 2013/0069133 A1  Mar. 21, 2013

(30) Foreign Application Priority Data

Sep. 21, 2011  (JP) ................................. 2011-206391

(51) Int. Cl.
*H01L 29/788* (2006.01)
*H01L 27/115* (2006.01)

(52) U.S. Cl.
CPC .... *H01L 27/11558* (2013.01); *H01L 27/11531* (2013.01)

(58) Field of Classification Search
USPC .................. 257/288, 314, 316, 319, 322, 390
See application file for complete search history.

(56) References Cited

U.S. PATENT DOCUMENTS 6,864,539 B2 * 3/2005 Ishibashi et al. ............... 257/368
2010/0270606 A1  10/2010 Kutsukake et al.

FOREIGN PATENT DOCUMENTS

JP  2011-40467  2/2011

* cited by examiner

*Primary Examiner* — Minchul Yang
(74) *Attorney, Agent, or Firm* — Oblon, McClelland, Maier & Neustadt, L.L.P.

(57) ABSTRACT

A semiconductor device, includes: a semiconductor substrate; a first conductivity type well and a second conductivity type well; a first active area; a second active area; a first well contact layer; a plurality of first source/drain layers; a first gate insulating film; a first gate electrode; a second well contact layer; a plurality of second source/drain layers; a second gate insulating film; and a second gate electrode. The first well contact layer is formed in the first active area at one end part in the one direction. The one end parts in each of the first active areas and in each of the second active areas are mutually on the same side.

18 Claims, 12 Drawing Sheets

SEMICONDUCTOR DEVICE

CROSS-REFERENCE TO RELATED APPLICATIONS

This application is based upon and claims the benefit of priority from the prior Japanese Patent Application No. 2011-206391, filed on Sep. 21, 2011; the entire contents of (all of) which are incorporated herein by reference.

FIELD

Embodiments described herein relate generally to a semiconductor device.

BACKGROUND

In recent years, there has been more increasing demand for higher levels of integration in semiconductor memory devices such as NAND-type flash memories. However, to achieve high integration in a semiconductor memory device, it is required to scaling-down individual constituent elements, which results in a problem of difficulty in manufacturing process.

DETAILED DESCRIPTION

Figure 1:
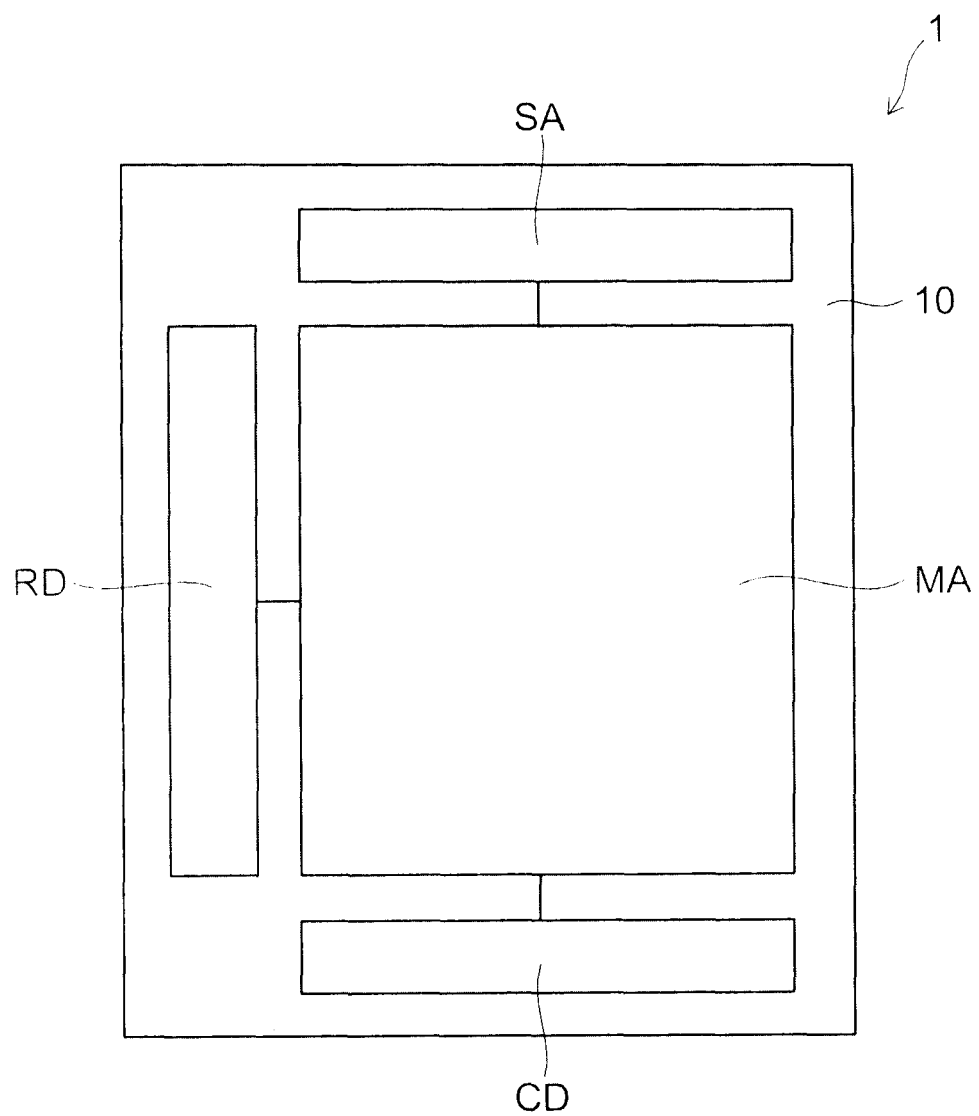
FIG. 1 is a block diagram illustrating a semiconductor device according to the embodiment.

In general, according to one embodiment a semiconductor device includes: a semiconductor substrate; a first conductivity type well and a second conductivity type well that are formed on an upper layer part of the semiconductor substrate and are alternately arranged along one direction; a first active area that is formed on an upper face of the semiconductor substrate, constitutes a part of the first conductivity type well, and has a longitudinal direction in the one direction; a second active area that is formed on the upper face of the semiconductor substrate, constitutes a part of the second conductivity type well, and has a longitudinal direction in the one direction; a first well contact layer that is formed in the first active area at one end part in the one direction, is a first conductivity type, and has an effective impurity concentration higher than an effective impurity concentration of the first conductivity type well; a plurality of first source/drain layers which are intermittently formed along the one direction at a part excluding the one end part in the first active area, and each of which is a second conductivity type, and has an effective impurity concentration higher than an effective impurity concentration of the second conductivity type well; a first gate insulating film that is provided on a part which is sandwiched between the first source/drain layers in the first active area; a first gate electrode provided on the first gate insulating film; a second well contact layer that is formed in the second active area at one end part in the one direction, is a second conductivity type, and has an effective impurity concentration higher than an effective impurity concentration of the second conductivity type well; a plurality of second source/drain layers which are intermittently formed along the one direction at a part excluding the one end part in the second active area, and each of which is a first conductivity type, and has an effective impurity concentration higher than an effective impurity concentration of the first conductivity type well; a second gate insulating film that is provided on a part sandwiched between the second source/drain layers in the second active area; and a second gate electrode provided on the second gate insulating film. The one end parts in each of the first active areas and in each of the second active areas are mutually on the same side.

According to another embodiment, a semiconductor device includes: a semiconductor substrate; a first conductivity type well formed on an upper layer part of the semiconductor substrate; an active area that is formed on an upper face of the semiconductor substrate and constitutes a part of the first conductivity type well; a well contact layer that is formed at one end part of the active area in a longitudinal direction, is a first conductivity type, and has an effective impurity concentration higher than an effective impurity concentration of the first conductivity type well; a plurality of source/drain layers that are intermittently formed at a part excluding the one end part in the active area; an element isolation insulator disposed around the active area; a gate insulating film that is provided on a part sandwiched between the source/drain layers in the active area; and a gate electrode provided on the gate insulating film. The well contact layer is separated from the element isolation insulator.

According to another embodiment, a semiconductor device includes: a semiconductor substrate; a first conductivity type well and a second conductivity type well that are formed on an upper layer part of the semiconductor substrate and are alternately arranged along a first direction; a plurality of first active areas that are formed on an upper face of the semiconductor substrate, each constitute a part of the first conductivity type well, have a longitudinal direction in the first direction, and are arranged in a line along a second direction intersecting the first direction; a plurality of second active areas that are formed on the upper face of the semiconductor substrate, each constitute a part of the second conductivity type well, have a longitudinal direction in the first direction, and are arranged in a line along the second direction; a first well contact layer that is formed at one end part in each of the first active areas in the first direction, is a first conductivity type, and has an effective impurity concentration higher than an effective impurity concentration of the first conductivity type well; a plurality of first source/drain layers which are intermittently formed at a part excluding the one end part in each of the first active areas, and each of which is a second conductivity type, and has an effective impurity concentration higher than an effective impurity concentration of the second conductivity type well; a first gate insulating film that is provided on a part sandwiched between the first source/drain layers in the first active area; a first gate electrode provided on the first gate insulating film; a second well contact layer that is formed at one end part in each of the second active areas in the first direction, is a second conductivity type, and has an effective impurity concentration higher than an effective impurity concentration of the second conductivity type well; a plurality of second source/drain layers which are intermittently formed at a part of each of the second active areas excluding the one end part, and each of which is a first conductivity type, and has an effective impurity concentration higher than an effective impurity concentration of the first conductivity type well; a second gate insulating film that is provided on a part sandwiched between the second source/drain layers in the second active area; a second gate electrode provided on the second gate insulating film; a first contact that is connected commonly to the first well contact layer and one of the first source/drain layers; a second contact that is connected commonly to the second well contact layer and one of the second source/drain layers; a third contact that is connected to another one of the first source/drain layers; and a fourth contact that is connected to another one of the second source/drain layers. The one end parts in each of the first active areas and in each of the second active areas are mutually on the same side. As seen from above, the third contact and the fourth contact are formed in a shape having a longitudinal direction in the second direction, and the first contact and the second contact are formed in shapes in which the third contact and the fourth contact are turned so as to have a longitudinal direction in the first direction as seen from above. The semiconductor device is a NAND-type flash memory. The first active areas and the second active areas are formed in a sense amplifier region.

Embodiments of the invention will be described below with reference to the drawings.

First, a first embodiment will be described.

Figure 2:
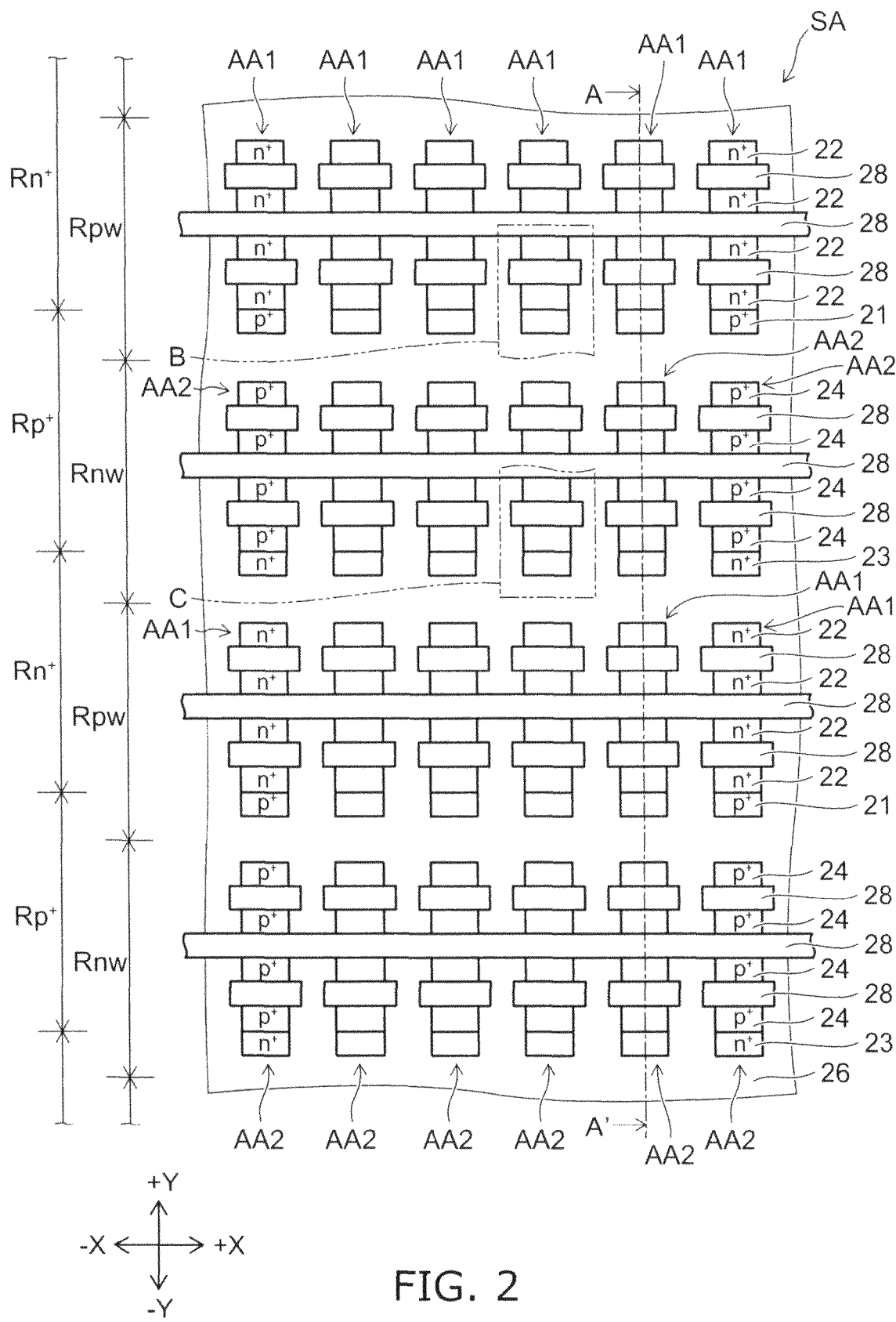
FIG. 2 is a plan view illustrating a sense amplifier region of the semiconductor device according to the embodiment.
Figure 3:
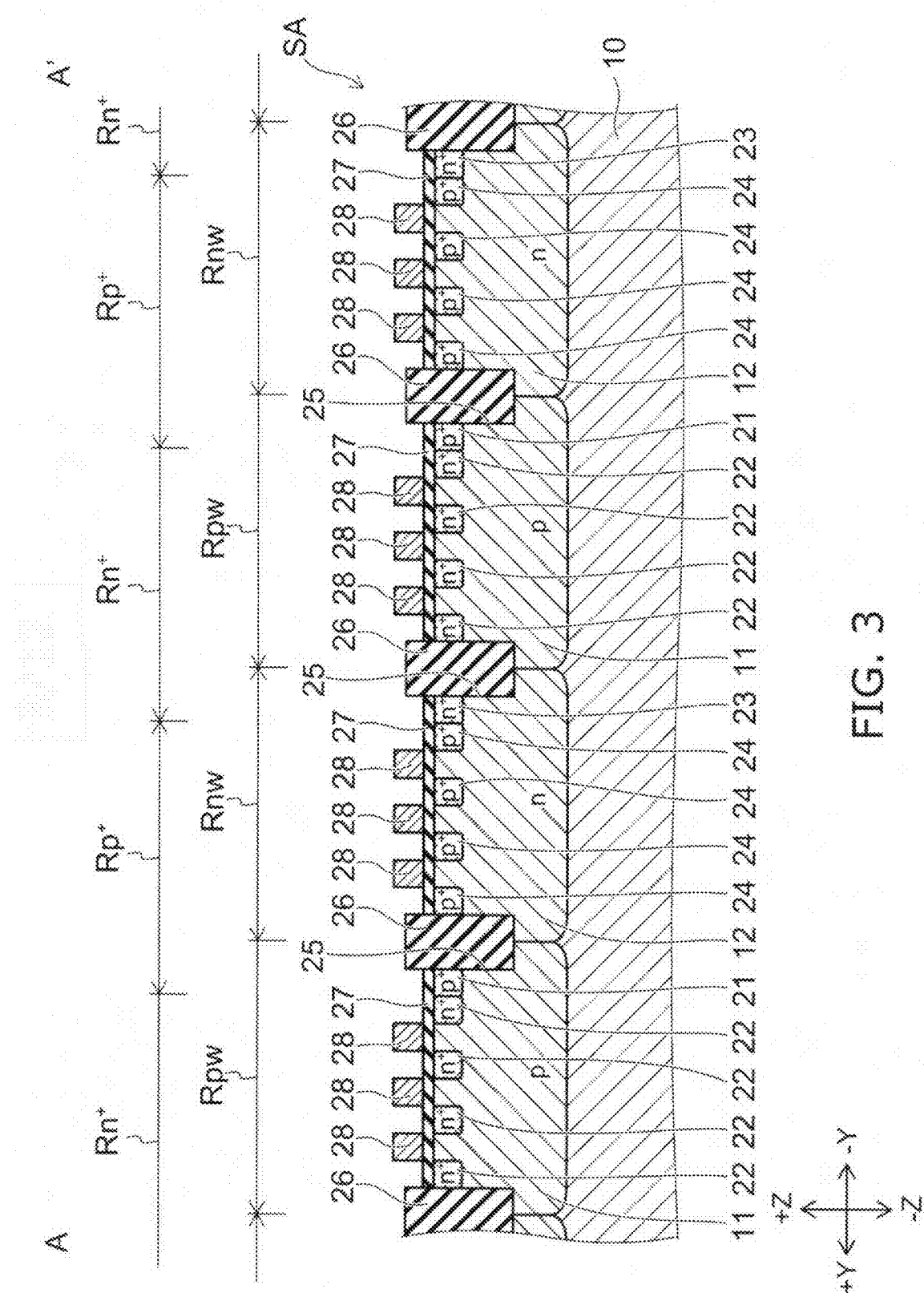
FIG. 3 is a cross section view of FIG. 2 taken along line A-A'.

FIG. 1 is a block diagram illustrating a semiconductor device according to the embodiment;

FIG. 2 is a plan view illustrating a sense amplifier region of the semiconductor device according to the embodiment;

FIG. 3 is a cross section view of FIG. 2 taken along line A-A'; and

Figure 4:
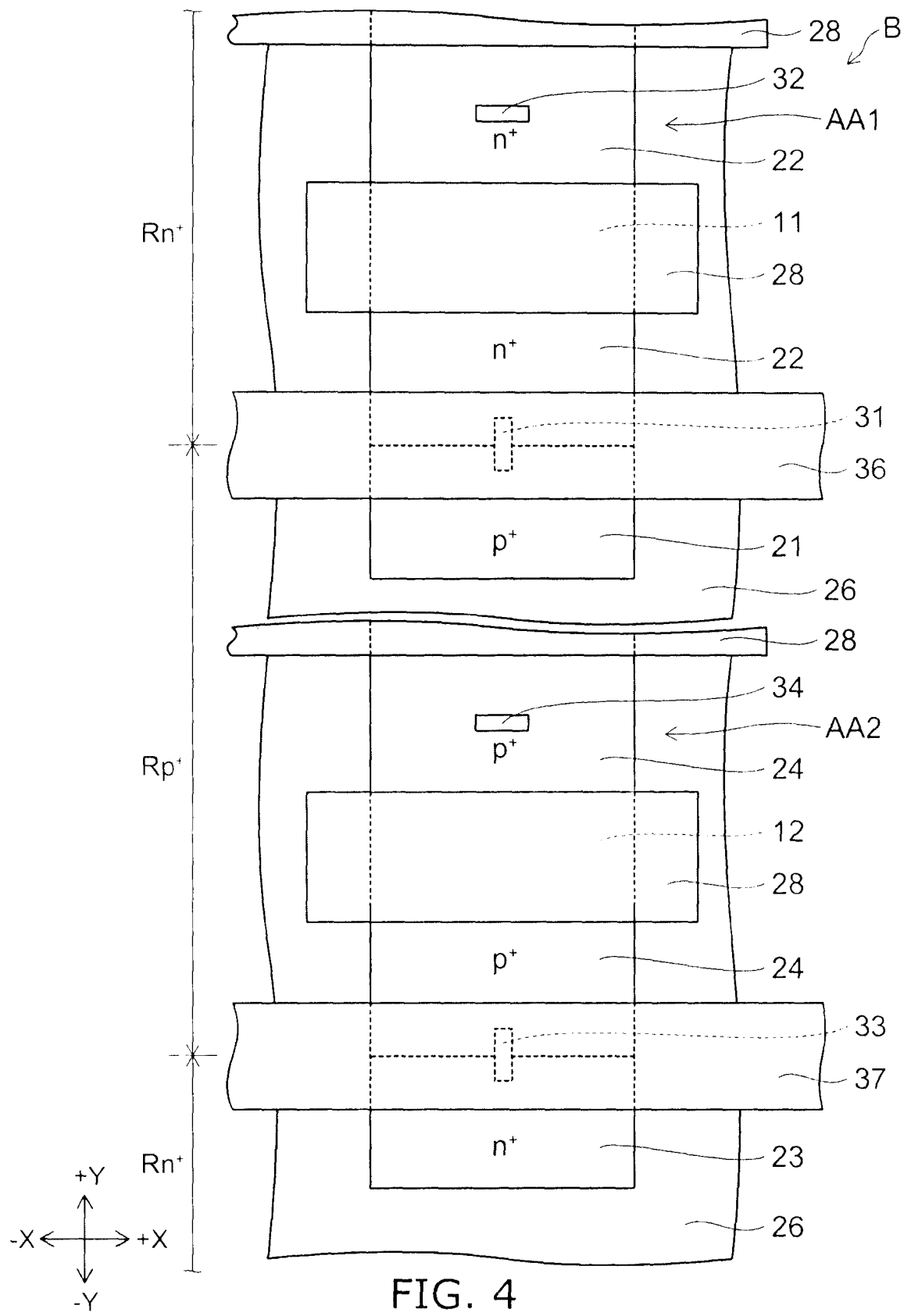
FIG. 4 is a plan view illustrating regions B and C shown in FIG. 2.

FIG. 4 is a plan view illustrating regions B and C shown in FIG. 2.

The semiconductor device according to the embodiment is an NAND-type flash memory.

As shown in FIG. 1, a semiconductor device 1 according to the embodiment is provided with a silicon substrate 10. A memory array region MA is set in a part of an upper face of the silicon substrate 10. In addition, a surrounding circuit region including a sense amplifier region SA, a row decoder region RD, and a column decoder region CD, is set around the memory array region MA.

As shown in FIGS. 2 and 3, in the sense amplifier region SA, a plurality of p-type wells 11 and a plurality of n-type wells 12 are formed in an upper layer part of the silicon substrate 10. The p-type wells 11 and the n-type wells 12 are alternately arranged along one direction. Hereinafter, a region in which the p-type wells 11 are formed will be referred to as a p-type well region Rpw, and a region in which the n-type wells 12 are formed will be referred to as an n-type well region Rnw.

For convenience of description, an XYZ orthogonal coordinate system is set herein. A direction in which the p-type wells 11 and the n-type wells 12 are arranged is designated as "Y direction." Among directions parallel to the upper face of the silicon substrate 10, a direction orthogonal to the "Y direction" is designated as "X direction." In addition, a direction orthogonal to both the "X direction" and the "Y direction" is designated as "Z direction." In addition, a one-side direction of the Y direction, for example, an upward direction shown in FIG. 2 is designated as "+Y direction," and the opposite direction thereof is designated as "−Y direction." The same also applies to the "X direction" and the "Z direction." The p-type well region Rpw and the n-type well region Rnw are each band-like regions extending in the X direction.

In the p-type well region Rpw, active areas AA1 are formed on the upper layer part of the silicon substrate 10. The active area AA1 partially constitute the p-type well 11. In each of the p-type well regions Rpw, a plurality of active areas AA1 are arranged in a line along the X direction. As seen from above, the shape of the active area AA1 is a rectangle having a longitudinal direction in the Y direction.

Similarly, in the n-type well region Rnw, active areas AA2 are formed on the upper layer part of the silicon substrate 10. The active area AA2 partially constitute the n-type well 12. In each of the n-type well regions Rnw, a plurality of active areas AA2 are arranged in a line along the X direction. As seen from above, the shape of the active areas AA2 is a rectangle having a longitudinal direction in the Y direction.

That is, all of the active areas AA1 and AA2 (hereinafter, also referred to as collectively "active areas") are the same in shape and direction of arrangement. Accordingly, in the sense amplifier area SA, the active areas are arranged in a matrix along the X direction and along the Y direction. Also, the length of the rectangular major axes, i.e., the length of the active area along the Y direction, may differ mutually between the active area AA1 and the active area AA2.

Formed at an end part in the active area AA1 on a −Y direction side is a $p^+$-type well contact layer 21. The conductivity type of the $p^+$-type well contact layer 21 is p type, and the effective impurity concentration of the $p^+$-type well contact layer 21 is higher than the effective impurity concentration of the p-type well 11. Incidentally, the description "effective impurity concentration" herein refers to the concentration of impurities contributing to conductivity of a semiconductor material. For example, if a semiconductor material contains both donor impurities and acceptor impurities, the "effective impurity concentration" refers to the concentration of impurities from which an offset of donors and acceptors is excluded.

In addition, a plurality of $n^+$-type source/drain layers 22 are formed at parts excluding the end parts on the −Y direction side in the active area AA1. The conductivity type of the $n^+$-type source/drain layer 22 is n type, and the effective impurity concentration of the $n^+$-type source/drain layer 22 is higher than the effective impurity concentration of the n-type wells 12. In each of the active areas AA1, a plurality of $n^+$-type source/drain layers 22 are intermittently formed along the Y direction. In addition, among a plurality of $n^+$-type source/drain layers 22 formed in each of the active areas AA1, the $n^+$-type source/drain layer 22 disposed closest to the −Y direction side is formed next to the $p^+$-type well contact layer 21.

Similarly, $n^+$-type well contact layers 23 are formed in the active areas AA2 at end parts on the −Y direction side. That is, the end parts of the active areas AA1 at which the $p^+$-type well contact layers 21 are disposed, and the end parts of the active areas AA2 at which the $n^+$-type well contact layers 23 are disposed, are located on the same side. The conductivity type of the n+-type well contact layers is n type, and the effective impurity concentration of the n+-type well contact layers 23 is higher than the effective impurity concentration of the n-type wells 12.

In addition, a plurality of p+-type source/drain layers 24 are formed in the active areas AA2 excluding end parts on the −Y direction side. The conductivity type of the p+-type source/drain layers 24 is p type, and the effective impurity concentration of the p+-type source/drain layers 24 is higher than the effective impurity concentration of the p-type wells 11. In each of the active areas AA2, a plurality of p+-type source/drain layers 24 are intermittently formed along the Y direction. Out of a plurality of p+-type source/drain layers 24 formed in each of the active areas AA2, the p+-type source/drain layer 24 disposed closest to the −Y direction side is formed next to the n+-type well contact layer 23.

When the p+-type well contact layers 21, the n+-type source/drain layers 22, and the n+-type well contact layers 23, and the p+-type source/drain layers 24 are disposed as described above, the p+-type well contact layers 21 disposed in an active area AA1 and a plurality of p+-type source/drain layers 24 disposed in an active area AA2 next to the foregoing active area AA1 on the −Y direction side as seen from the foregoing area AA1, are positioned in the same continuous p+ implant region Rp+. In addition, as seen from these active areas AA1 and AA2, the p+-type well contact layer 21 in the active area AA1 arranged on the X direction side and the p+-type source/drain layers 24 in the active area AA2 on the X direction side, are also positioned in the same p+ implant region Rp+.

Similarly, the n+-type well contact layer 23 disposed in an active area AA2 and a plurality of n+-type source/drain layers 22 disposed in an active area AA1 disposed next to the foregoing active area AA2 on the −Y direction side as seen from the foregoing active area AA2, are positioned in the same continuous n+ implant region Rn+. In addition, as seen from these active areas AA2 and AA1, the n+-type well contact layer 23 in the active area AA2 disposed on the X direction side and the n+-type source/drain layers 22 in the active area AA1 disposed on the X direction side, are also positioned in the same n+ implant region Rn+.

The p+ implant regions Rp and the n+ implant regions Rn are alternately arranged along the Y direction. Arrangement of the p+ implant regions Rp+ and the n+ implant regions Rn+ is equal in direction and cycle to arrangement of the p-type well regions Rpw and the n-type well regions Rnw, and arrangement of the p+ implant regions Rp+ and the n+ implant regions Rn+ is shifted in phase from arrangement of the p-type well regions Rpw and the n-type well regions Rnw.

Meanwhile, regions with no active areas formed on the upper layer part of the silicon substrate 10 are cut away to form grooves 25 in which shallow trench isolations (STIs) 26 are provided as element isolation insulators. Specifically, the STIs 26 are disposed between the active areas to electrically isolate the active areas. As seen from above, the shape of the STIs 26 is a lattice. In addition, the STIs 26 have upper parts projecting from the upper face of the silicon substrate 10. Meanwhile, the upper face of the STIs 26 may be lower than the upper face of the silicon substrate 10. In this case, etching process is performed to make the upper face of the STIs 26 low.

In addition, gate isolating films 27 are provided on parts of the silicon substrate 10 that are not covered with the STIs 26. In FIG. 2, the gate insulating films 27 are omitted for the sake of visibility. The same also applies to other plan views (FIGS. 4, 5, 7, 8, and 10) described later. Gate electrodes 28 are provided on the gate insulating film 27 in regions immediately above channel regions between the n+-type source/drain layers 22 and in regions immediately above channel regions between the p+-type source/drain layers 24. The gate electrodes 28 extend in the X direction and cross over the active areas. Some of the gate electrodes 28 cross over only one active area, and others cross over a plurality of active areas arranged in the X direction.

Accordingly, a plurality of n channel-type metal-oxide-semiconductor field-effect transistor (MOSFETs) are provided in each of the active areas AA1, and a plurality of p channel-type MOSFETs are provided in each of the active areas AA2. The source/drain layers are shared between adjacent MOSFETs.

In the example shown in FIGS. 2 and 3, four n+-type source/drain layers 22 are formed in each of the active areas AA1 and three gate electrodes 28 are provided on the four n+-type source/drain layers 22, and four p+-type source/drain layers 24 are formed in each of the active areas AA2 and three gate electrodes 28 are provided on the four p+-type source/drain layers 24. However, the embodiment of the invention is not limited to this arrangement. The number of the n+-type source/drain layers 22 formed in each of the active areas AA1 and the number of the p+-type source/drain layers 24 formed in each of the active areas AA2, can be arbitrarily decided. Therefore, the number of the MOSFETs formed in these active areas can also be arbitrarily decided. However, the number of the p+-type well contact layer 21 to be formed in each of the active areas AA1 is one, and the number of the n+-type well contact layer 23 to be formed in each of the active areas AA2 is also one. In addition, the p+-type well contact layers 21 and the n+-type well contact layers 23 are disposed at end parts on the same side in all of the active areas, that is, at the end parts on the −Y direction side.

As shown in FIG. 4, at the end part of each of the active areas AA1 on the −Y direction side, a contact 31 is provided in a region including a boundary between the p+-type well contact layer 21 and the n+-type source/drain layer 22 in contact with the p+-type well contact layer 21 as seen from above. The shape of the contact 31 is a rectangle or an approximate rectangle having a longitudinal direction in the Y direction as seen from above. In addition, the p+-type well contact layer 21 and the n+-type source/drain layer 22 in contact with each other, are commonly connected to a lower end of the contact 31. In addition, a contact 32 is provided on the n+-type source/drain layer 22 not in contact with the p+-type well contact layer 21. As seen from above, the shape of the contact 32 is a rectangle or an approximate rectangle having a longitudinal direction in the X direction, and the n+-type source/drain layer 22 is connected to a lower end of the contact 32.

Similarly, at an end part of each of the active areas AA2 on the −Y direction side, a contact 33 is provided in a region including a boundary between the n+-type well contact layer 23 and the p+-type source/drain layer 24 in contact with the n+-type well contact layer 23 as seen from above. As seen from above, the shape of the contact 33 is a rectangle or an approximate rectangle having a longitudinal direction in the Y direction. In addition, the n+-type well contact layer 23 and the p+-type source/drain layer 24 are commonly connected to a lower end of the contact 33. In addition, a contact 34 is provided on the p+-type source/drain layer 24 not in contact with the n+-type well contact layer 23. As seen from above, the shape of the contact 34 is a rectangle or an approximate rectangle having a longitudinal direction in the X direction, and the p+-type source/drain layer 24 is connected to a lower end of the contact 34.

As described above, the contacts 31 and 33 each have a longitudinal direction in the Y direction, and the contacts 32 and 34 each have a longitudinal direction in the X direction. Not considering the longitudinal direction, the contacts 31 to 34 are the same in shape as seen from above. Specifically, the contacts 31 and 33 are formed in the shapes of the contacts 32 and 34 which are turned so as to have a longitudinal direction in the Y direction as seen from above. In addition, the contacts 31 and 33 are butting contacts connected to two layers. Since the contacts 31 and 33 are connected to the two layers arranged along the Y direction, the contacts 31 and 33 each preferably have a longitudinal direction in the Y direction. However, the contacts 32 and 34 are connected to only one layer, and hence may each have a longitudinal direction in the X direction or in the Y direction.

A wiring 36 is provided on the contact 31 and is connected to an upper end of the contact 31. In addition, a wiring 37 is provided on the contact 33 and is connected to an upper end of the contact 33. Further, wirings (not shown) are also provided on the contacts 32 and 34, and the contacts 32 and 34 are connected to the wirings. For the sake of convenience of illustration, the contacts 31 to 34 and the wirings 36 and 37 are omitted in FIGS. 2 and 3.

The sense amplifier region SA of the semiconductor device 1 according to the embodiment is generally formed in a procedure described below. Specifically, impurities as acceptors are ion-implanted into the p-type well regions Rpw, and impurities as donors are ion-implanted into the n-type well regions Rnw, thereby to form the p-type wells 11 and the n-type wells 12 on the upper layer part of the silicon substrate 10. Next, the lattice-shaped grooves 25 are formed in the upper face of the silicon substrate 10, and the STIs 26 are formed in the grooves 25, thereby to define some parts of the p-type wells 11 as active areas AA1 and define some parts of the n-type wells 12 as active areas AA2. Then, impurities as acceptors are ion-implanted into the $p^+$ implant regions $Rp^+$ to form the $p^+$-type well contact layers 21 and the $p^+$-type source/drain layers 24. In addition, impurities as donors are ion-implanted into the n implant regions $Rn^+$ to form the $n^+$-type well contact layers 23 and the $n^+$-type source/drain layers 22. Accordingly, with respect to the Z direction (up-down direction), the impurity concentration profile in the depth direction of the $p^+$-type well contact layers 21 and the impurity concentration profile in the depth direction of the $p^+$-type source/drain layers 24 are almost equal to each other. In addition, the impurity concentration profile in the depth direction of the $n^+$-type well contact layers 23 and the impurity concentration profile in the depth direction of the $n^+$-type source/drain layers 22 are almost equal to each other.

Next, advantages of the embodiment will be described.

In the embodiment, a plurality of active areas formed in the sense amplifier region SA have the shape of a rectangle having a longitudinal direction in the Y direction. In addition, the active areas are arranged in a matrix in the X direction and the Y direction, as seen from above. As in the foregoing, in the embodiment, the active areas are arranged in a simple repetitive pattern, which facilitates lithography for forming the grooves 25 in the upper face of the silicon substrate 10 and separating the active areas. Accordingly, even if the active areas are miniaturized, it is possible to maintain the uniform shape of the active areas and the uniform characteristics of the MOSFETs formed in the active areas. In other words, it is possible to achieve high integration of the MOSFETs while maintaining uniformity in the characteristics of the MOSFETs.

In addition, in the embodiment, the $p^+$-type well contact layer 21 and the $n^+$-type source/drain layers 22 are disposed in the same active area AA1, and the $n^+$-type well contact layer 23 and the $p^+$-type source/drain layers 24 are disposed in the same active area AA2. This achieves size reduction of the sense amplifier region SA. In addition, setting the contacts 31 and 33 as butting contacts decreases the number of contacts and makes the sense amplifier region SA further smaller in size. Moreover, forming the contacts 31 and 33 in the shape in which the contacts 32 and 34 are turned so as to have a longitudinal direction in the Y direction as seen from above, thereby to set the contacts 31 and 33 as butting contacts. Accordingly, the contacts 31 to 34 are of the same shape, thereby facilitating lithography.

Further, in the embodiment, the well contact layers are disposed at the end parts of the active areas on the same side, that is, at the end parts of the active areas on the −Y direction side. Accordingly, the $p^+$-type well contact layer 21 formed in an active area AA1 and the $p^+$-type source/drain layers 24 formed in an active area AA2 disposed on the −Y direction side as seen from the foregoing active area AA1, are positioned in the same $p^+$ implant region $Rp^+$. This allows the $p^+$-type well contact layer 21 and the $p^+$-type source/drain layers 24 to be formed by the same ion implantation ($p^+$ implantation). In addition, an opening part of a resist mask for use in the ion-implantation can be formed of the same shape as the $p^+$ implant region $Rp^+$, thereby resulting in less strict constraints on size of the opening part.

Similarly, the $n^+$-type well contact layer 23 formed in an active area AA2 and the $n^+$-type source/drain layers 22 formed in an active area AA1 on the −Y direction side as seen from the active area AA2, are positioned in the same $n^+$ implant region $Rn^+$. This allows the $n^+$-type well contact layers 23 and the $n^+$-type source/drain layers 22 to be formed by the same ion-implantation ($n^+$ implantation). In addition, an opening part of a resist mask for use in the ion-implantation can be formed of the same shape as the region $Rn^+$, thereby resulting in less strict constraints on size of the opening.

As in the foregoing, the $p^+$-type well contact layer 21 and the $p^+$-type source/drain layers 24 can be formed at the same time on conditions with less strict constraints on size of the openings. The same also applies to the $n^+$-type well contact layer 23 and the $n^+$-type source/drain layers 22. This facilitates formation of these layers.

Next, a second embodiment will be described below.

Figure 5:
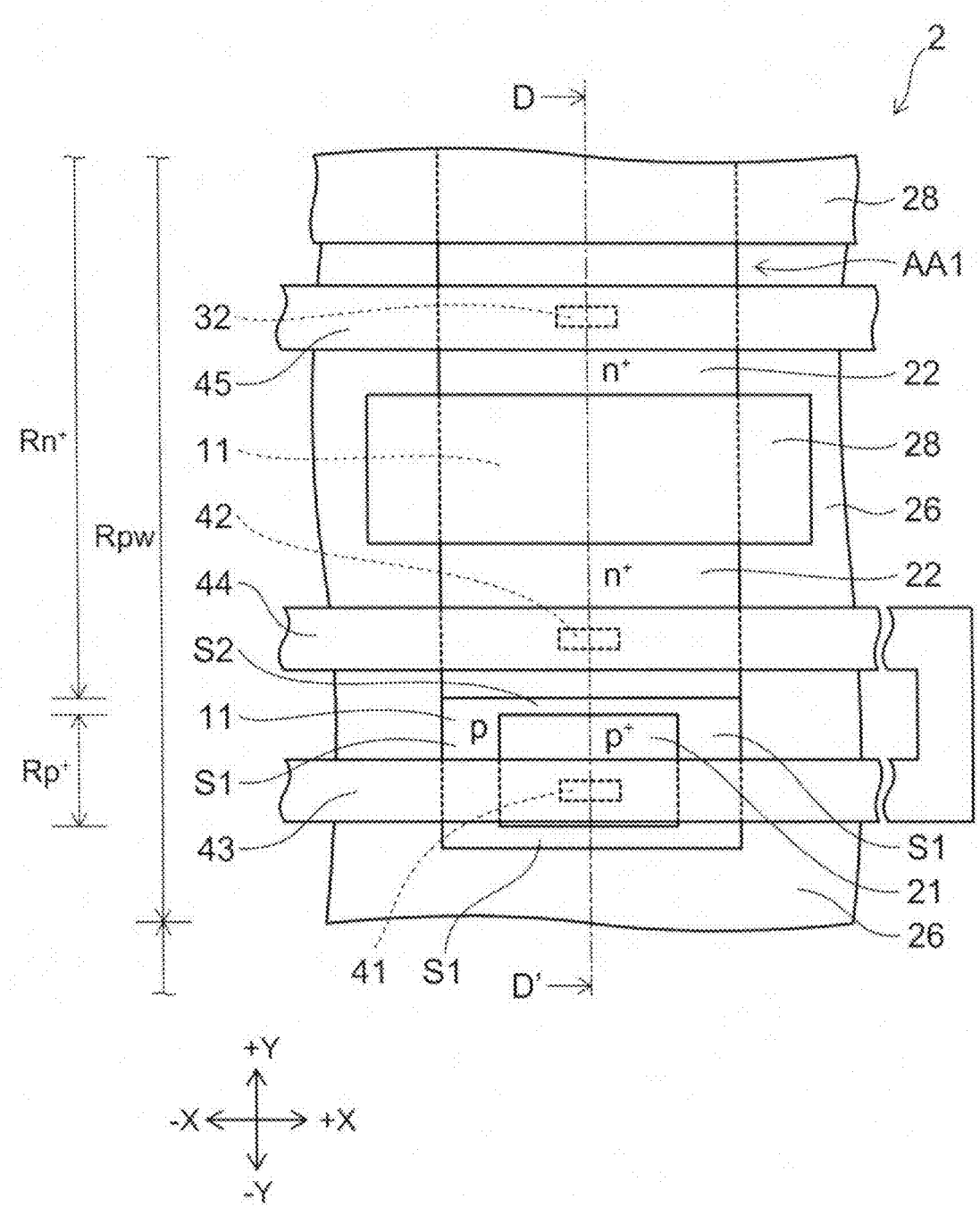
FIG. 5 is a plan view illustrating an end part of an active area in a semiconductor device according to the embodiment.
Figure 6:
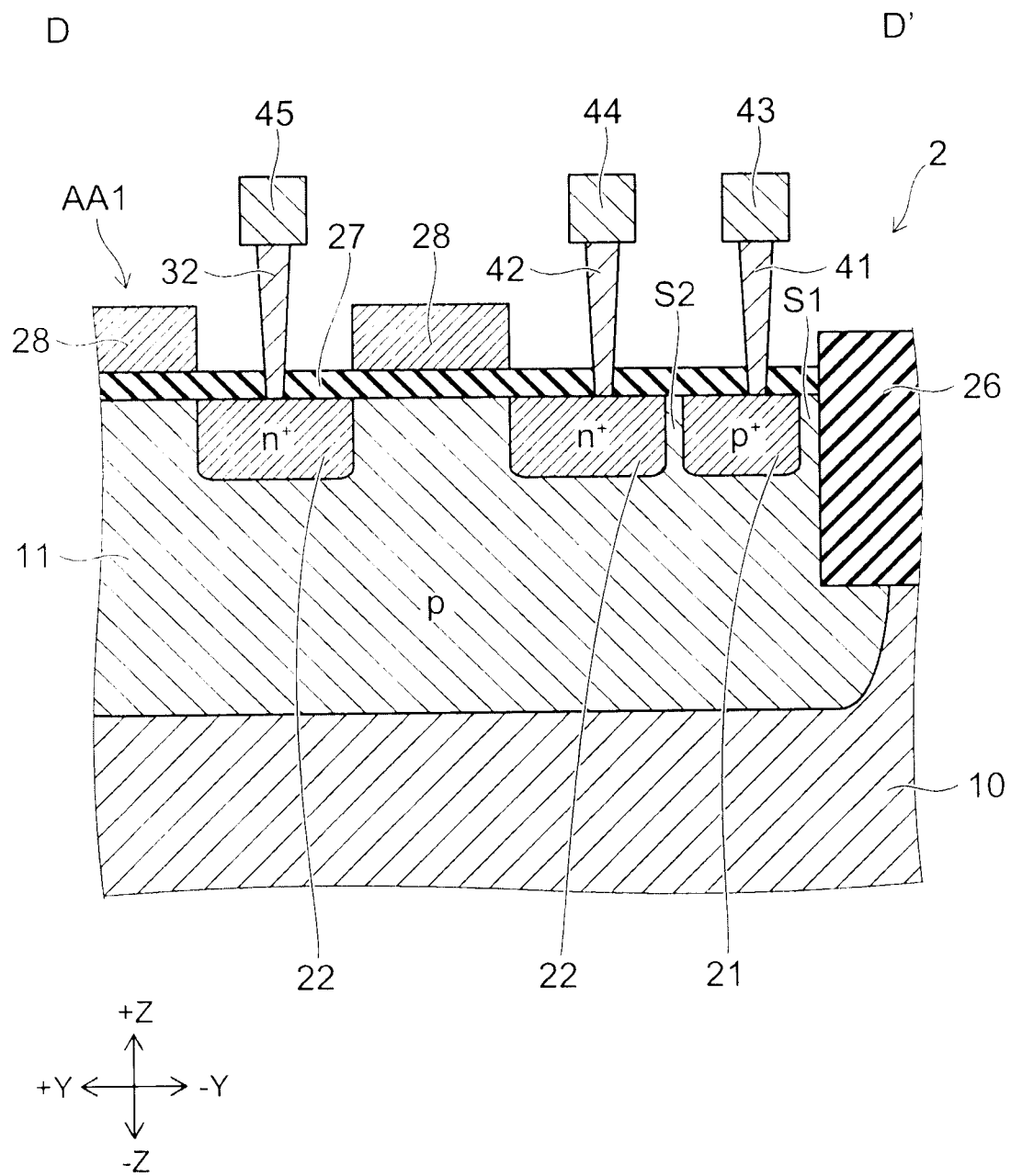
FIG. 6 is a cross section view of FIG. 5 taken along line D-D'.

FIG. 5 is a plan view illustrating an end part of an active area in a semiconductor device according to the embodiment; and FIG. 6 is a cross section view of FIG. 5 taken along line D-D'.

As shown in FIGS. 5 and 6, as compared to the semiconductor device 1 according to the first embodiment (refer to FIGS. 1 to 4), a semiconductor device 2 according to the embodiment is different from the semiconductor device 1, in that the $p^+$-type well contact layer 21 and the $n^+$-type well contact layer 23 (hereinafter, also referred to as collectively "well contact layers") are separated from the STIs 26, the $n^+$-type source/drain layers 22, and the $p^+$-type source/drain layers 24 (hereinafter, referred to as collectively "source/drain layers").

Specifically, the $p^+$-type well contact layer 21 formed in each of the active areas AA1, is formed in a region distant from the STI 26 at the end part of the active area AA1 on the −Y direction side. In addition, the $p^+$-type well contact layer 21 is separated from the $n^+$-type source/drain layer 22 disposed in the active area AA1 closest to the −Y direction side. The p-type wells 11 are intervened in a gap S1 between the $p^+$-type well contact layer 21 and the STI 26, and is intervened in a gap S2 between the p$^+$-type well contact layer 21 and the n$^+$-type source/drain layer 22. The gap S1 has a width of about 0.1 to 0.3 μm, for example.

In addition, the p$^+$-type well contact layer 21 is connected to a contact 41, and the n$^+$-type source/drain layer 22 disposed in each of the active areas AA1 closest to the −Y direction side is connected to a contact 42. The contact 41 is connected to a wiring 43, and the contact 42 is connected to a wiring 44. The wiring 43 and the wiring 44 are connected to each other, and the same potential is applied to the wirings. Meanwhile, the n$^+$-type source/drain layers 22 other than the n$^+$-type source/drain layer 22 disposed closest to the −Y direction side, are connected to a wiring 45 via the contact 32. The contacts 32, 41, and 42 are the same in shape and orientation. The same also applies to an arrangement of the n$^+$-type well contact layer 23 formed in each of the active areas AA2 (refer to FIG. 4) and a circumference of the n$^+$-type well contact layer 23. Arrangements other than the foregoing one in the embodiment are the same as the arrangements in the first embodiment.

Next, advantages of the embodiment will be described below.

In the embodiment, well contact layers are formed in regions separated from STIs 26. Accordingly, at a time of ion-implantation for formation of the well contact layers, it is possible to prevent that impurity ions are implanted into parts of a silicon substrate 11 in contact with the STIs 26 and crystal fault is generated originating from interfaces with the STIs 26. As a result, generation of leak current due to such crystal fault can be prevented.

The semiconductor device 2 according to the embodiment is an NAND-type flash memory in which a large number of memory cells are formed in a memory array region MA (FIG. 1). In addition, if the memory cells are highly integrated in the memory array region MA, there is a smaller difference in read current between the case where electric charge is accumulated in the memory cells and the case where no electric charge is accumulated in the memory cells, and therefore it is necessary to further improve the sense amplifier in performance. According to the embodiment, it is possible to reduce leak current in the MOSFETs formed in the sense amplifier region SA, thereby achieving enhancement in performance of the sense amplifier. This realizes high integration of the memory cells.

In addition, in the embodiment, the active areas are arranged in a simple repetitive pattern as in the first embodiment, thereby lowering a difficulty level of lithography. This makes it possible to miniaturize the active areas while maintaining uniformity in the shape of the active areas. Further, lithography can be facilitated by making the contacts the same in shape and orientation.

Next, a third embodiment will be described below.

Figure 7:
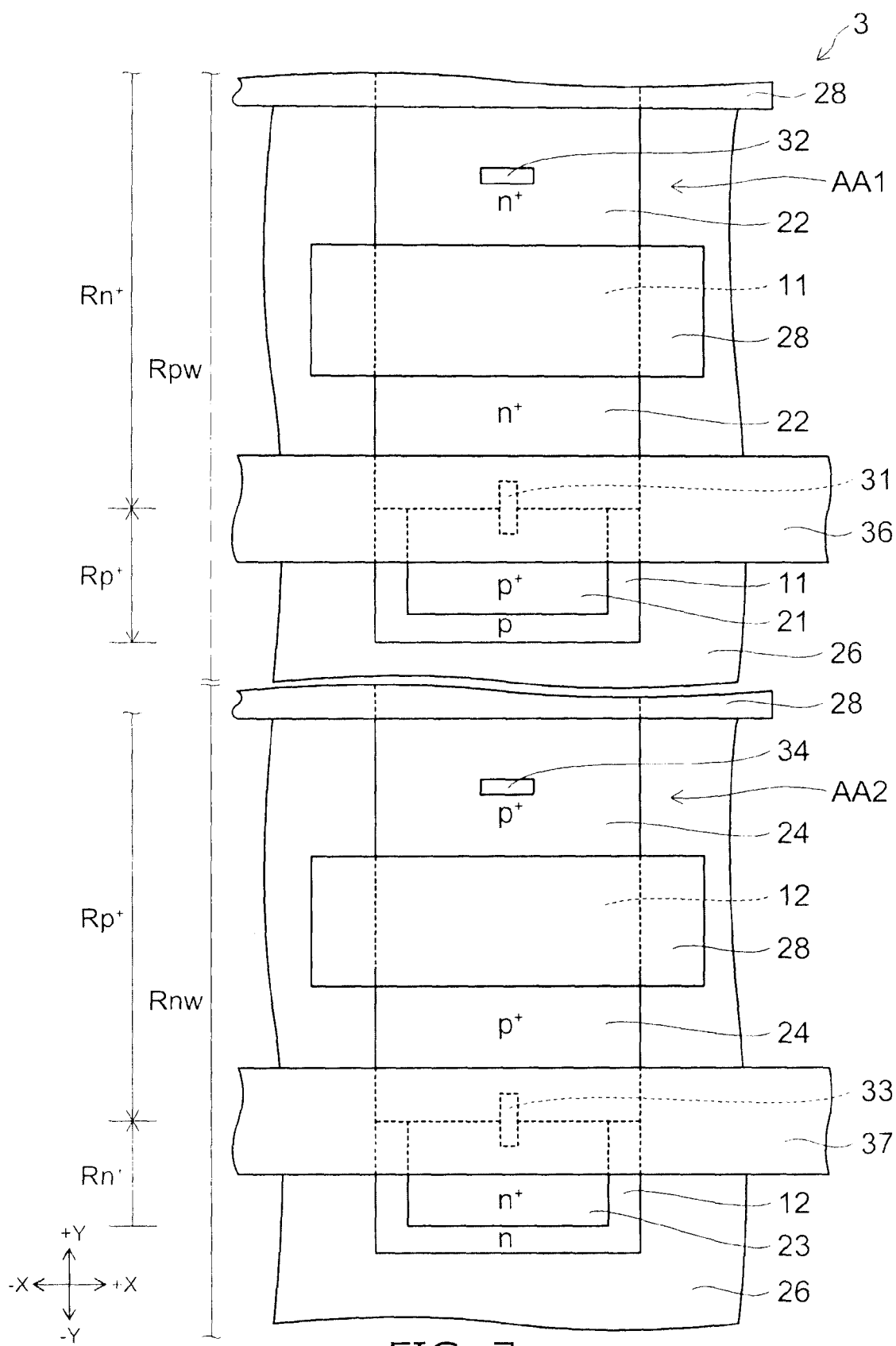
FIG. 7 is a plan view illustrating an end part of an active area in a semiconductor device according to the embodiment.

FIG. 7 is a plan view illustrating an end part of an active area in a semiconductor device according to the embodiment.

As shown in FIG. 7, in a semiconductor device 3 according to the embodiment, the p$^+$-type well contact layer 21 and the n$^+$-type well contact layer 23 are separated from the STIs 26, as in the semiconductor device 2 according to the second embodiment (refer to FIG. 5). In addition, the p$^+$-type well contact layer 21 is disposed next to the n$^+$-type source/drain layer 22, and the n$^+$-type well contact layer 23 is disposed next to the p$^+$-type source/drain layer 24, as in the semiconductor device 1 according to the first embodiment (refer to FIG. 4). Further, the p$^+$-type well contact layer 21 and the n$^+$-type source/drain layer 22 are connected to the common contact 31, and the n$^+$-type well contact layer 23 and the p$^+$-type source/drain layer 24 are connected to the common contact 33. Arrangements in the embodiment other than the foregoing ones are the same as the arrangements in the first embodiment.

In the embodiment, as in the first embodiment, an advantage of maintaining the uniform shape of active areas can be obtained by laying out the active areas in a simple repetitive pattern; an advantage of reducing the size of the sense amplifier region SA can be obtained by arranging the well contact layer and the source/drain layers in the same active area; an advantage of reducing the size of the sense amplifier region SA can be obtained by setting the contacts 31 and 33 as butting contacts; and an advantage of facilitating lithography can be obtained by forming the contacts 31 to 34 in the same shape. In addition, as in the second embodiment, an advantage of suppressing leak current resulting from crystal fault can be obtained by forming the well contact layers in regions separated from the STI 26.

Next, a fourth embodiment will be described.

Figure 8:
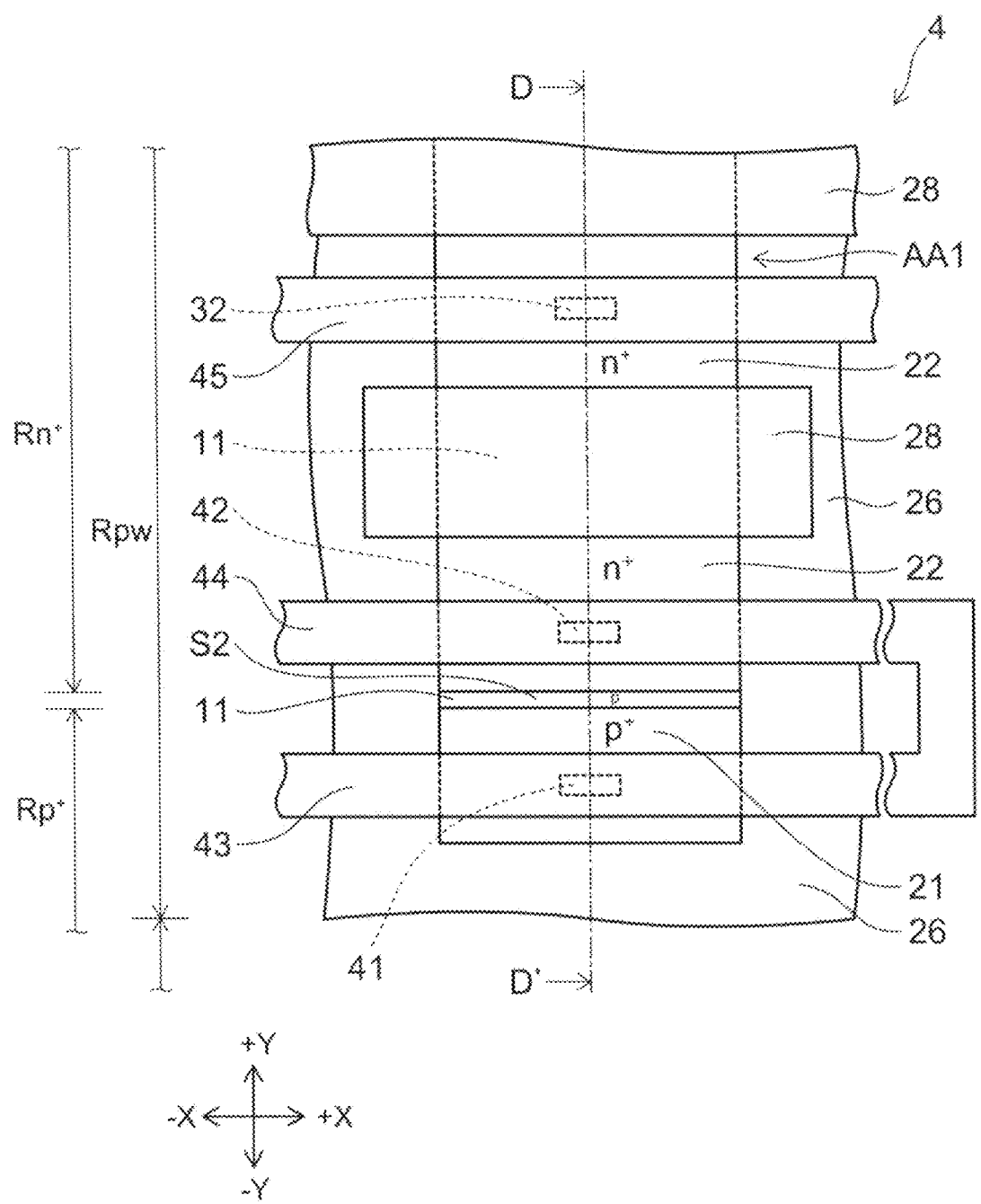
FIG. 8 is a plan view illustrating an end part of an active area in a semiconductor device according to the embodiment.

FIG. 8 is a plan view illustrating an end part of an active area in a semiconductor device according to the embodiment.

As shown in FIG. 8, in a semiconductor device 4 according to the embodiment, the well contact layers (the p$^+$-type well contact layer 21 and the n$^+$-type well contact layer 23) are formed up to an end edge of the active area on the −Y direction side and along the entire length of the active area in the X direction, as in the semiconductor device 1 according to the first embodiment (refer to FIG. 4). Therefore, the well contact layers are in contact with the STI 26. In addition, the well contact layers formed in the same active area and the source/drain layers closest to the well contact layers are separated from each other and are connected to separate contacts, as in the semiconductor device 2 according to the second embodiment (refer to FIG. 5). Arrangements in the embodiment other than the foregoing one are the same as the arrangements in the first embodiment.

In the embodiment, as in the first embodiment, an advantage of maintaining the uniform shape of active areas can be obtained by laying out the active areas in a simply repeated pattern; an advantage of reducing size of the sense amplifier region SA can be obtained by arranging the well contact layers and the source/drain layers in the same active area; and an advantage of allowing formation of the well contact layers and the source/drain layers in an adjacent active areas by the same ion-implantation can be obtained by arranging the well contact layers at the end parts of the active areas on the same side. In addition, as in the second embodiment, an advantage of facilitating lithography can be obtained by making the contacts identical in shape and orientation.

Next, a comparative example will be described below.

Figure 9:
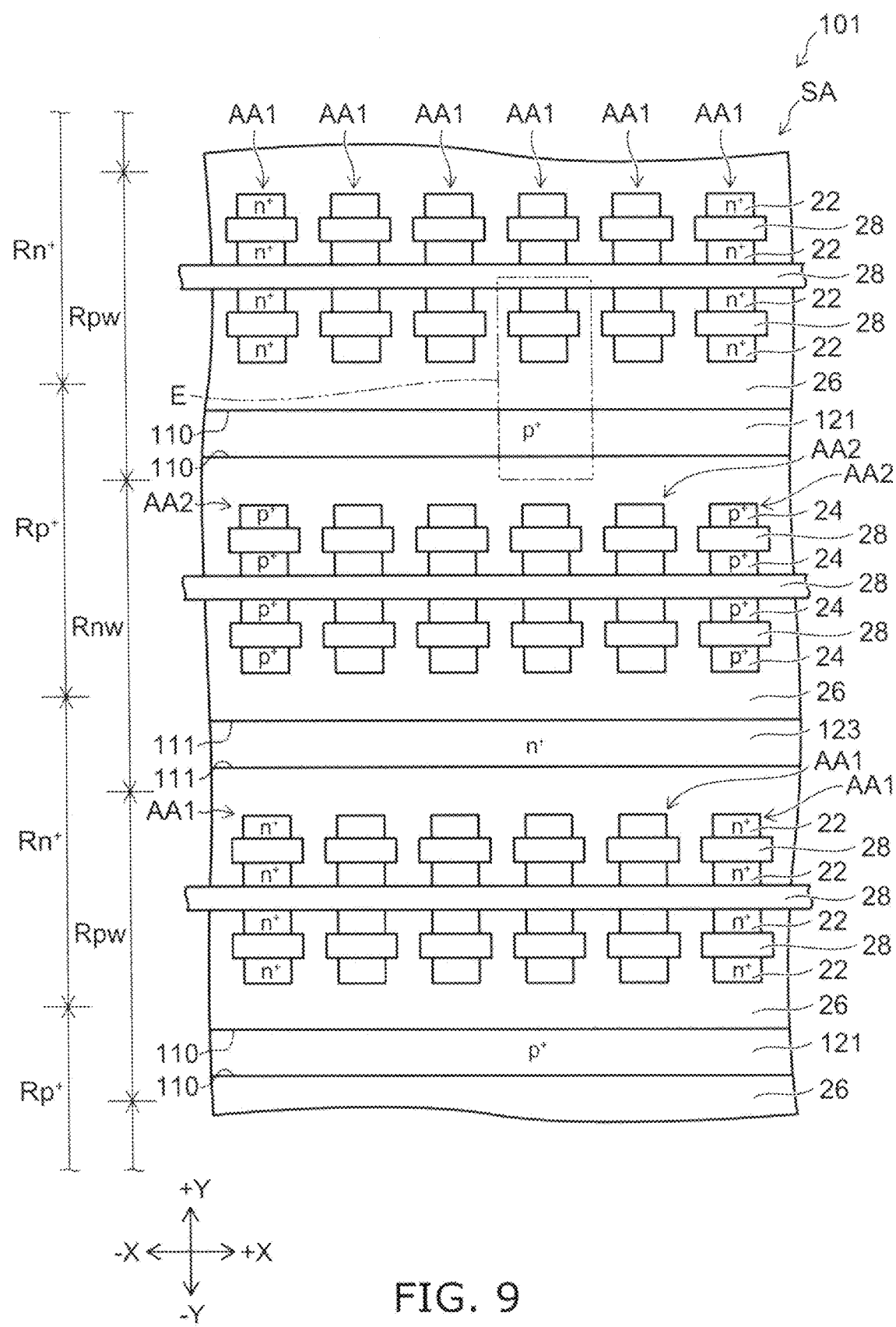
FIG. 9 is a plan view illustrating a sense amplifier region in a semiconductor device according to the comparative example.
Figure 10:
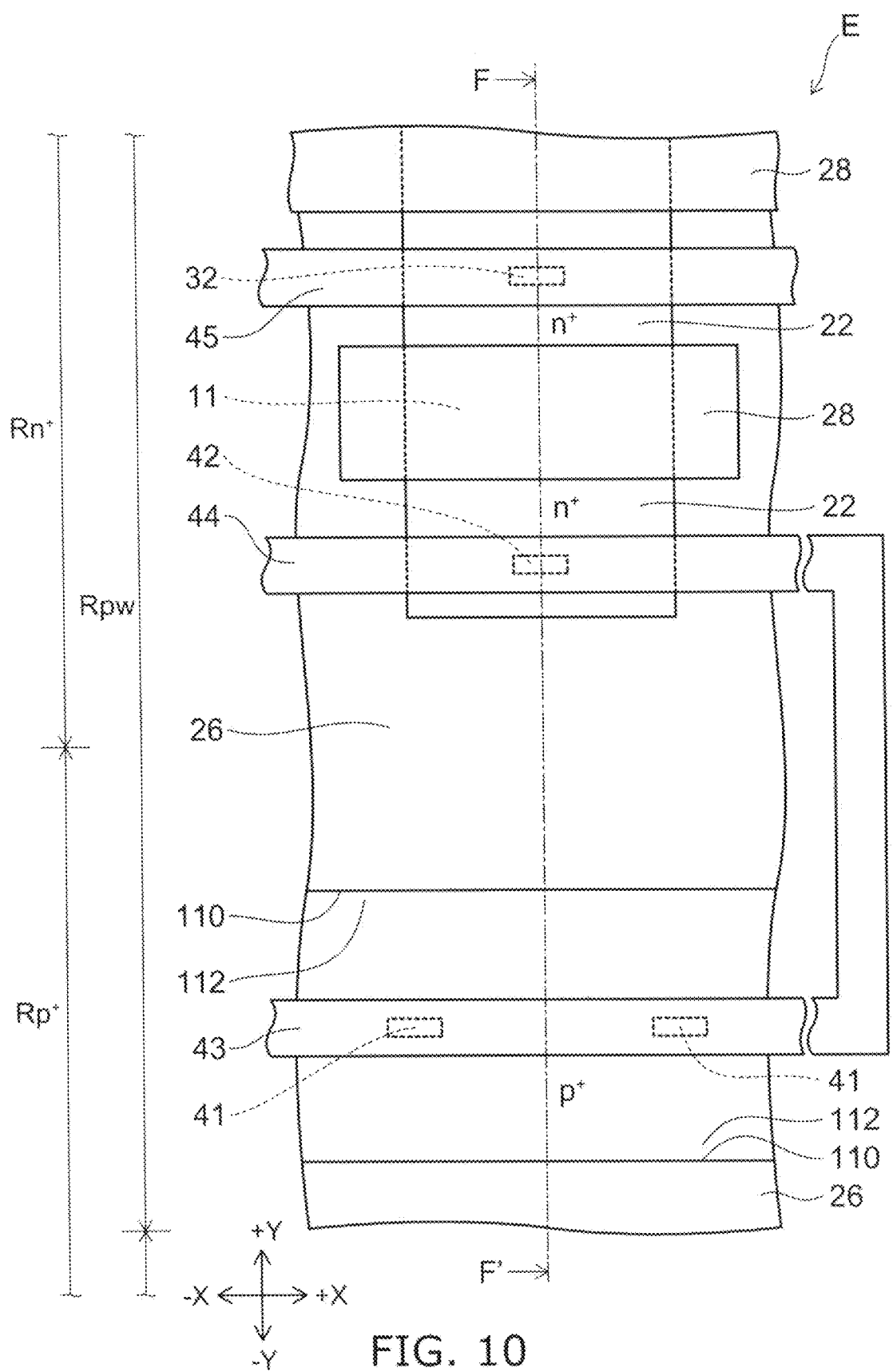
FIG. 10 is a plan view illustrating a region E shown in FIG. 9.

FIG. 9 is a plan view illustrating a sense amplifier region in a semiconductor device according to the comparative example;

FIG. 10 is a plan view illustrating a region E shown in FIG. 9; and

Figure 11:
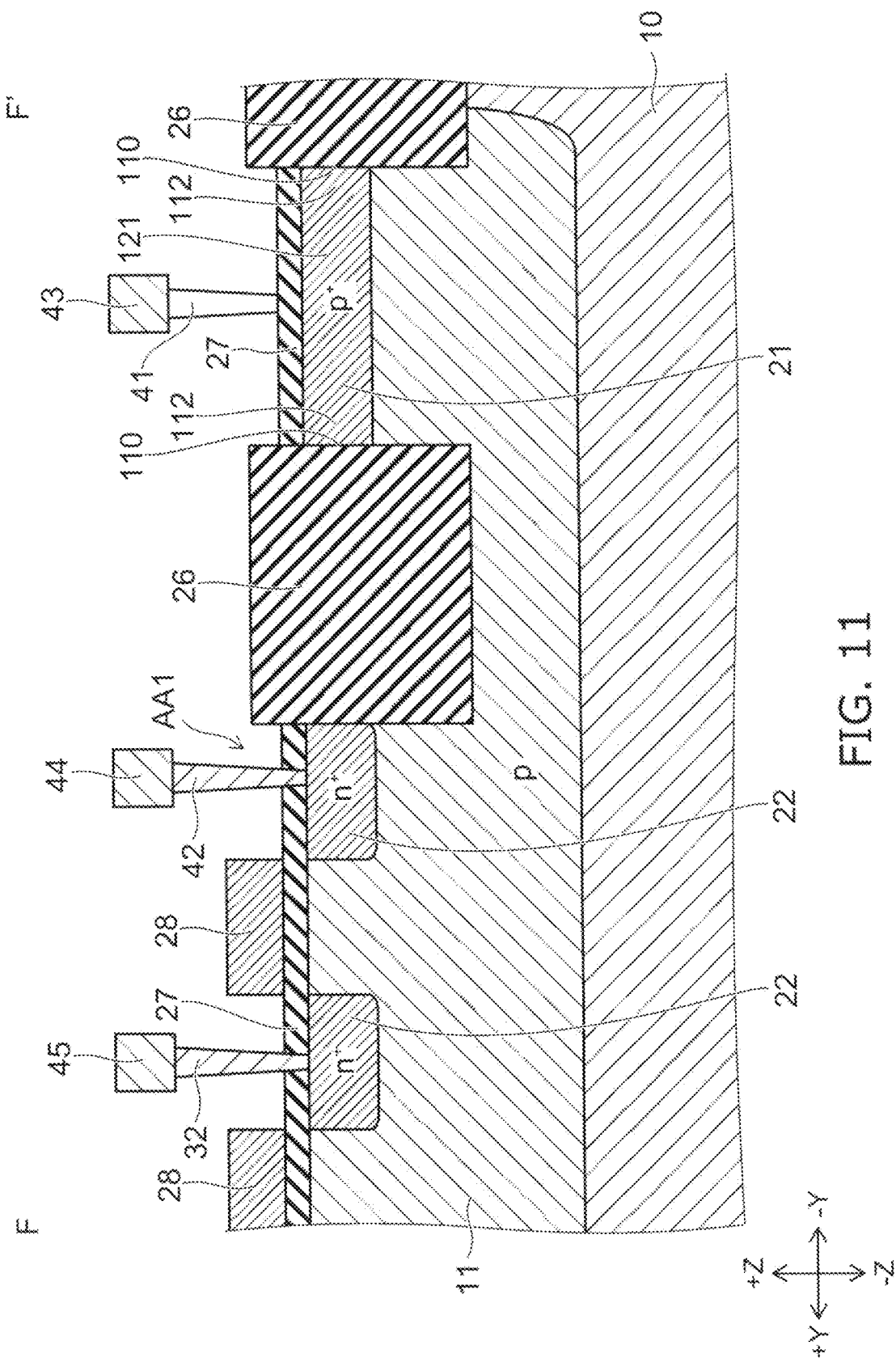
FIG. 11 is a cross section view of FIG. 10 taken along line F-F'.

FIG. 11 is a cross section view of FIG. 10 taken along line F-F'.

As shown in FIGS. 9 to 11, in a semiconductor device 101 according to the comparative example, well contact layers are formed outside active areas. Specifically, in each of p-type wells 11, one stripe p$^+$-type well contact layer 121 is formed so as to extend in the X direction in a region on the −Y direction side as seen from a plurality of active areas AA1 arranged in a line along the X direction. In addition, in each of the p-type wells 11, an STI 26 is intervened between the active areas AA1 and the p$^+$-type well contact layer 121. Similarly, in each of n-type wells 12, one stripe n$^+$-type well contact layer 123 is formed so as to extend in the X direction in a region on the −Y direction side as seen from a plurality of active areas AA2 arranged in a line along the X direction, and the STI 26 is intervened between the active areas AA2 and the n⁺-type well contact layer 123.

In the comparative example, the active areas AA1 and AA2 are formed in the shape of a rectangle having a longitudinal direction in the Y direction, and the p⁺-type well contact layers 121 and the n⁺-type well contact layers 123 are formed in the shape of a stripe extending in the X direction. As in the foregoing, in the comparative example, layout of the active areas including the well contact layers is complicated with mixture of parts extending in the X direction and parts extending in the Y direction, which makes lithography difficult. This inhibits high integration of the sense amplifier region SA.

In addition, in the comparative example, it is necessary to set the p⁺ implant regions Rp⁺ for formation of the p⁺-type well contact layers 121 as to include interfaces 110 between the p-type wells 11 and the STIs 26. Accordingly, there is a possibility that crystal fault is generated originating from the interfaces 110, at parts 112 of the p⁺-type well contact layers 121 in contact with the interfaces 110. If crystal fault is generated in any of the p⁺-type well contact layers 121, leak current flows into the crystal fault as a current path. Similarly, in the n⁺-type well contact layer 123, it is necessary to set the n⁺ implant regions Rn⁺ so as to include interfaces 111 between the n-type wells 11 and the STIs 26. In this case, there is a possibility that crystal fault is introduced into parts of the n⁺-type well contact layers 123 in contact with the interfaces 111, thereby resulting in leak current. In addition, if leak current is generated due to crystal fault, characteristics of a sense amplifier are deteriorated.

Further, in the comparative example, each of the p⁺-type well contact layers 121 is disposed in a position separated from the active area AA1, and the STI 26 is intervened between the two. In addition, each of the n⁺-type well contact layers 123 is disposed in a position separated from the active area AA2, and the STI 26 is intervened between the two. This makes the sense amplifier region SA longer in the Y direction. This also inhibits high integration of the sense amplifier region SA. As in the foregoing, high integration is difficult in the semiconductor device 101 according to the comparative example.

In contrast to this, according to the foregoing first to fourth embodiments, the well contact layers are formed in each of the active areas, which realizes a simple layout of the active areas and facilitates lithography. This makes it possible to miniaturize the active areas while maintaining shape stability of the active areas. In addition, since no STI for separating the active areas and the well contact layers is provided, the sense amplifier region SA can be reduced in size. Further, according to the second and third embodiments, it is possible to suppress generation of crystal fault associated with ion-implantation and reduce leak current. In addition, in the first and fourth embodiments, contact areas between the p-type wells 11, the n-type wells 12, and the STIs 26 are smaller as compared with contact areas in the comparative example, thereby reducing leak current resulting from crystal fault.

Next, a working example will be described below.

In the working example, with regard to the semiconductor device 2 according to the second embodiment (refer to FIGS. 5 and 6) and the semiconductor device 101 according to the comparative example (refer to FIGS. 9 to 11), distributions of impurity concentrations were simulated in a region ranging from an STI to a well contact layer in the Y direction.

Figure 12:
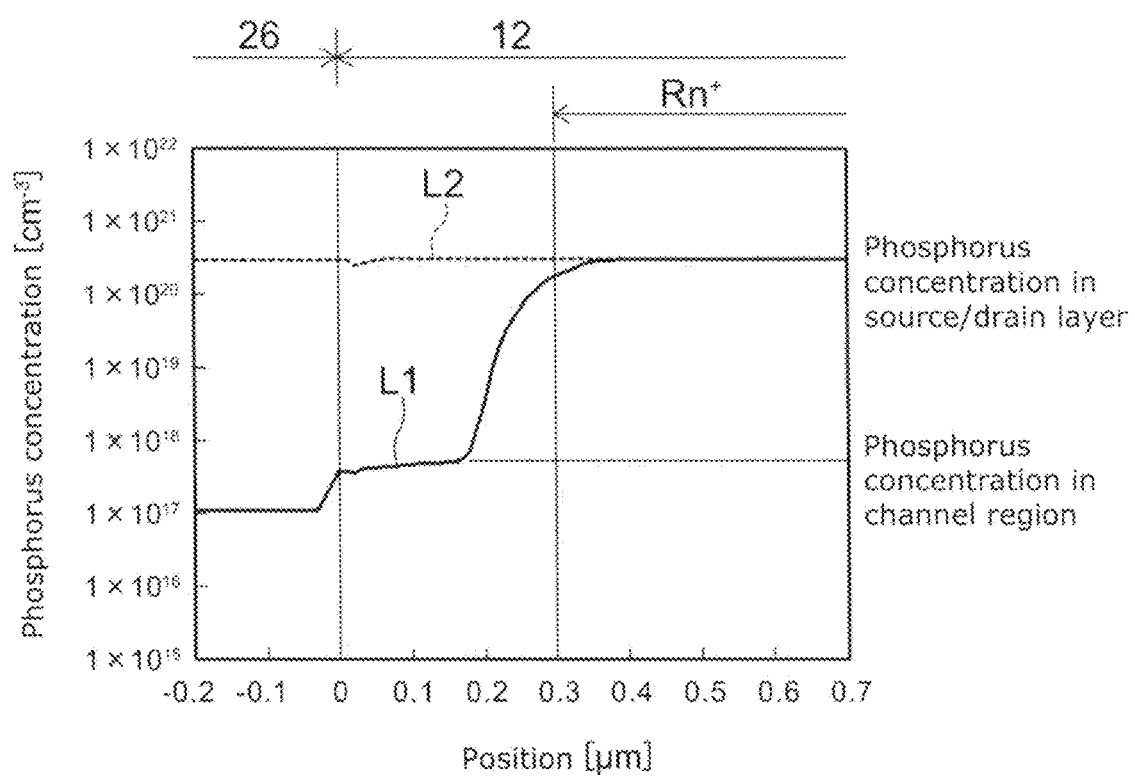
FIG. 12 is a graph illustrating a phosphorus concentration profile in an active area in which a horizontal axis indicates positions in the Y direction and a vertical axis indicates phosphorus concentrations.

FIG. 12 is a graph illustrating a phosphorus concentration profile in an active area in which a horizontal axis indicates positions in the Y direction and a vertical axis indicates phosphorus concentrations.

The horizontal axis in FIG. 12 represents positions in the Y direction with reference to an interface between the STI 26 and the n-type well. A range shown by positive figures in the horizontal axis in FIG. 12 corresponds to an inside of the n-type well 12 and an inside of the n⁺-type well contact layer 23 in the semiconductor device 2, and corresponds to an inside of the n⁺-type well contact layer 123 in the semiconductor device 101. Meanwhile, a range shown by negative figures in the same corresponds to an inside of the STI 26. In addition, the vertical axis in FIG. 12 represents phosphorus concentrations at a position of a depth of about 10 nm from an interface between the silicon substrate 10 and the gate insulating film 26.

A solid line L1 shown in FIG. 12 indicates a phosphorus concentration profile in a region ranging from the STI 26 through the n-type well 12 to the n⁺-type well contact layer 23 in the semiconductor device 2. In this arrangement, a distant between the STI 26 and the n⁺ implant region Rn⁺ is 0.3 µm.

A dashed line L2 shown in FIG. 12 indicates a phosphorus concentration profile in a region ranging from the STI 26 to the n⁺-type well contact layer 123 in the semiconductor device 101. In this arrangement, the n⁺ implant region Rn⁺ is set so as to include the interface 111 between the STI 26 and the n-type well 12.

As shown by the solid line L1 in FIG. 12, in the semiconductor device 2 according to the second embodiment, a phosphorus concentration was $1 \times 10^{20}$ to $1 \times 10^{21}$ cm$^{-3}$ in an inside of the active area AA2 at a part separated by about not less than 0.3 µm from the STI 26, that is, at a part corresponding to the n⁺ implant region Rn⁺, which is at the same level as a phosphorus concentration of the n⁺-type source/drain layer 22 (refer to FIG. 5). Meanwhile, a phosphorus concentration at a part of the active area AA2 at a distance not more than 0.2 µm from the STI 26, that is, at an end part of the active area AA2, was about $1 \times 10^{17}$ to $1 \times 10^{19}$ cm$^{-3}$, which is at the same level as a phosphorus concentration in a channel region.

In contrast to this, as shown by the dashed line L2 in FIG. 12, in the semiconductor device 101 according to the comparative example, a phosphorus concentration in the n⁺-type well contact layer 123 was almost constant regardless of a position in the Y direction and is about $1 \times 10^{20}$ to $1 \times 10^{21}$ cm$^{-3}$.

Although the concentration profile shown in FIG. 12 is the results of simulation on phosphorus, a similar profile will be obtained for boron. Specifically, the p⁺-type well contact layers 23 and 123 will exhibit profiles similar to the profile shown in FIG. 12. However, since boron is more prone to be diffused than phosphorus, a boron concentration profile in the semiconductor device 2 will become slightly gentler than the phosphorus concentration profile shown by the solid line L1 in FIG. 12.

In the semiconductor device 2, it is conceived that, even if a distant between the STI 26 and the implant region Rn⁺ is shortened down to 0.1 µm, a relationship between the impurity concentration of $1 \times 10^{20}$ to $1 \times 10^{21}$ cm$^{-3}$ at the part corresponding to the well contact layer and the impurity concentration of $1 \times 10^{17}$ to $1 \times 10^{19}$ cm$^{-3}$ at the end part of the active area, can be achieved.

According to the foregoing embodiments, it is possible to realize a semiconductor device capable of high integration.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a semiconductor substrate;
   a first conductivity type well and a second conductivity type well that are formed on an upper layer part of the semiconductor substrate and are alternately arranged along one direction;
   a first active area that is formed on an upper face of the semiconductor substrate, constitutes a part of the first conductivity type well, and has a longitudinal direction in the one direction;
   a second active area that is formed on the upper face of the semiconductor substrate, constitutes a part of the second conductivity type well, and has a longitudinal direction in the one direction;
   a first well contact layer that is formed in the first active area at one end part in the one direction, is a first conductivity type, and has an effective impurity concentration higher than an effective impurity concentration of the first conductivity type well;
   a plurality of first source/drain layers which are intermittently formed along the one direction at a part excluding the one end part in the first active area, and each of which is a second conductivity type, and has an effective impurity concentration higher than an effective impurity concentration of the second conductivity type well;
   a first gate insulating film that is provided on a part which is sandwiched between the first source/drain layers in the first active area;
   a first gate electrode provided on the first gate insulating film;
   a second well contact layer that is formed in the second active area at one end part in the one direction, is the second conductivity type, and has an effective impurity concentration higher than an effective impurity concentration of the second conductivity type well;
   a plurality of second source/drain layers which are intermittently formed along the one direction at a part excluding the one end part in the second active area, and each of which is the first conductivity type, and has an effective impurity concentration higher than an effective impurity concentration of the first conductivity type well;
   a second gate insulating film that is provided on a part sandwiched between the second source/drain layers in the second active area; and
   a second gate electrode provided on the second gate insulating film,
   the one end parts in each of the first active areas and in each of the second active areas formed on the same side.

2. The device according to claim 1, being a NAND-type flash memory, wherein the first active area and the second active area are formed in a sense amplifier region.

3. The device according to claim 1, further comprising:
   a plurality of other first active areas that constitute another part of the first conductivity type well and are arranged along other direction intersecting the one direction; and
   a plurality of other second active areas that constitute another part of the second conductivity type well and are arranged along the other direction.

4. The device according to claim 3, wherein the first active area, the other first active areas, the second active area, and the other second active areas, are arranged in a matrix along the one direction and along the other direction.

5. The device according to claim 3, wherein the first gate electrode crosses over the first active area and the other first active areas.

6. The device according to claim 1, further comprising
   an element isolation insulator disposed between the first active area and the second active area.

7. The device according to claim 1, further comprising:
   a first contact that is connected commonly to the first well contact layer and one of the first source/drain layers; and
   a second contact that is connected commonly to the second well contact layer and one of the second source/drain layers.

8. The device according to claim 7, wherein:
   the one first source/drain layer is in contact with the first well contact layer;
   as seen from above, the first contact is disposed in a region including a boundary between the first well contact layer and the one first source/drain layer;
   the one second source/drain layer is in contact with the second well contact layer; and
   as seen from above, the second contact is disposed in a region including a boundary between the second well contact layer and the one second source/drain layer.

9. The device according to claim 7, further comprising:
   a third contact connected to another one of the first source/drain layers; and
   a fourth contact connected to another one of the second source/drain layers, wherein
   as seen from above, the third contact and the fourth contact are each formed in a shape having a longitudinal direction in other direction intersecting the one direction, and the first contact and the second contact are each formed in a shape in which the third contact and the fourth contact are turned so as to have a longitudinal direction in the one direction as seen from above.

10. The device according to claim 7, further comprising:
    a third contact connected to another one of the first source/drain layers; and
    a fourth contact connected to another one of the second source/drain layers, wherein
    as seen from above, the first contact, the second contact, the third contact, and the fourth contact, are the same in shape and orientation.

11. The device according to claim 1, further comprising:
    a first contact that is connected to the first well contact layer;
    a second contact that is connected to one of the first source/drain layers;
    a first wiring that is connected to the first contact; and
    a second wiring that is connected to the second contact, the first wiring and the second wiring being connected to each other.

12. The device according to claim 1, further comprising:
    an element isolation insulator disposed between the first active area and the second active area, wherein
    the first well contact layer and the second well contact layer are separated from the element isolation insulator.

13. The device according to claim 1, wherein
    the first well contact layer is separated from all of the first source/drain layers, and the second well contact layer is separated from all of the second source/drain layers.

14. The device according to claim 1, wherein
the first well contact layer is in contact with one of the first source/drain layers, and
the second well contact layer is in contact with one of the second source/drain layers.

15. The device according to claim 1, wherein with respect to a vertical direction, an impurity concentration profile in depth direction of the first well contact layer and an impurity concentration profile in the depth direction of the second source/drain layer are equal, and an impurity concentration profile in the depth direction of the second well contact layer and an impurity concentration profile in the depth direction of the first source/drain layer are equal.

16. The device according to claim 1, wherein three of the first gate electrodes are located in a region immediately above the first active area.

17. A semiconductor device, comprising:
a semiconductor substrate;
a first conductivity type well formed on an upper layer part of the semiconductor substrate;
an active area that is formed on an upper face of the semiconductor substrate and constitutes a part of the first conductivity type well;
a well contact layer that is formed at one end part of the active area in a longitudinal direction, is a first conductivity type, and has an effective impurity concentration higher than an effective impurity concentration of the first conductivity type well;
a plurality of source/drain layers that are intermittently formed at a part excluding the one end part in the active area;
an element isolation insulator disposed around the active area;
a gate insulating film that is provided on a part sandwiched between the source/drain layers in the active area; and
a gate electrode provided on the gate insulating film, wherein
the well contact layer is separated from the element isolation insulator.

18. A semiconductor device, comprising:
a semiconductor substrate;
a first conductivity type well and a second conductivity type well that are formed on an upper layer part of the semiconductor substrate and are alternately arranged along a first direction;
a plurality of first active areas that are formed on an upper face of the semiconductor substrate, each constitute a part of the first conductivity type well, have a longitudinal direction in the first direction, and are arranged along a second direction intersecting the first direction;
a plurality of second active areas that are formed on the upper face of the semiconductor substrate, each constitute a part of the second conductivity type well, have a longitudinal direction in the first direction, and are arranged along the second direction;
a first well contact layer that is formed at one end part in each of the first active areas in the first direction, is a first conductivity type, and has an effective impurity concentration higher than an effective impurity concentration of the first conductivity type well;
a plurality of first source/drain layers which are intermittently formed at a part excluding the one end part in each of the first active areas, and each of which is a second conductivity type, and has an effective impurity concentration higher than an effective impurity concentration of the second conductivity type well;
a first gate insulating film that is provided on a part sandwiched between the first source/drain layers in the first active area;
a first gate electrode provided on the first gate insulating film;
a second well contact layer that is formed at one end part in each of the second active areas in the first direction, is the second conductivity type, and has an effective impurity concentration higher than an effective impurity concentration of the second conductivity type well;
a plurality of second source/drain layers which are intermittently formed at a part of each of the second active areas excluding the one end part, and each of which is the first conductivity type, and has an effective impurity concentration higher than an effective impurity concentration of the first conductivity type well;
a second gate insulating film that is provided on a part sandwiched between the second source/drain layers in the second active area;
a second gate electrode provided on the second gate insulating film;
a first contact that is connected commonly to the first well contact layer and one of the first source/drain layers;
a second contact that is connected commonly to the second well contact layer and one of the second source/drain layers;
a third contact that is connected to another one of the first source/drain layers; and
a fourth contact that is connected to another one of the second source/drain layers,
the one end parts in each of the first active areas and in each of the second active areas formed on the same side;
the semiconductor device being a NAND-type flash memory; and
the first active areas and the second active areas being formed in a sense amplifier region.

* * * * *